United States Patent
Dokumaci et al.

(10) Patent No.: US 7,026,247 B2
(45) Date of Patent: Apr. 11, 2006

(54) NANOCIRCUIT AND SELF-CORRECTING ETCHING METHOD FOR FABRICATING SAME

(75) Inventors: Omer H. Dokumaci, Wappingers Falls, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/696,686

(22) Filed: Oct. 28, 2003

(65) Prior Publication Data

US 2005/0087809 A1    Apr. 28, 2005

(51) Int. Cl.
*H01L 21/461* (2006.01)

(52) U.S. Cl. ........................ 438/705; 438/947
(58) Field of Classification Search ............. 438/947, 438/705, 717, 950, 706; 430/313
See application file for complete search history.

(56) References Cited

U.S. PATENT DOCUMENTS

| 4,312,680 | A | * | 1/1982 | Hsu ............................ 438/151 |
| 6,025,273 | A | | 2/2000 | Chen et al. |
| 2002/0074313 | A1 | | 6/2002 | Hu et al. |

* cited by examiner

*Primary Examiner*—Carl Whitehead, Jr.
*Assistant Examiner*—Jennifer M. Dolan
(74) *Attorney, Agent, or Firm*—Scully, Scott, Murphy & Presser, P.C.; Todd M. C. Li

(57) ABSTRACT

A self-correcting etching (SCORE) process for fabricating microstructure is provided. The SCORE process of the present invention is particularly useful for reducing preselected features of a hard mask without degrading the variation of the critical dimension (CD) within each wafer. Alternatively, the CD variation of the hard mask features' produced during printing can be substantially reduced by applying SCORE. Hence, ultra-sub-lithographic features (e.g., nanostructures) can be reliably fabricated. Consequently, the method of the present invention can be used to increase the circuit performance, while improving the manufacturing yield.

16 Claims, 10 Drawing Sheets

NANOCIRCUIT AND SELF-CORRECTING ETCHING METHOD FOR FABRICATING SAME

FIELD OF THE INVENTION

The present invention relates to microstructures, including nanostructures and nanocircuits, and a method of fabricating the same. More particularly, the present invention relates to a method for self-correcting etching (SCORE) of various microstructures.

BACKGROUND OF THE INVENTION

In the field of semiconductor device manufacturing, there is a need for providing semiconductor devices such as complementary metal oxide semiconductor (CMOS) devices that contain ultra-sub-lithographic features. That is, there is a need for providing CMOS lines in which the dimensions thereof are less than 0.7 F, wherein F is the minimal lithographic dimension related to the wavelength of exposure.

In the prior art, CMOS devices that have a gate microstructure are fabricated using photolithography, which includes the steps of applying a photoresist and an optional antireflective coating (ARC) to a material needing patterning; exposing the photoresist to a pattern of radiation and developing the exposed photoresist; resist, antireflective coating (ARC), or hard mask trimming; and pattern transfer with or without trimming.

The prior art process is shown, for example, in FIGS. 1A–1D. In particular, FIG. 1A illustrates an intermediate structure after photolithography. The intermediate structure includes substrate 10, gate dielectric 12, gate conductor 14, hard mask 16 and a plurality of patterned photoresists labeled as 18a, 18b and 18c. Each patterned photoresist has a line width, L, associated therewith. In the example shown, $L_1$ of patterned photoresist 18a is greater than $L_{nom}$ of patterned photoresist 18b which is greater than $L_2$ of patterned photoresist 18c. The $L_{nom}$ denotes the actual line width of the patterned photoresist needed to achieve a desired lithographic feature; in the drawing the dotted region about $L_1$ and $L_2$ represents $L_{nom}$. As shown, the photolithographic processing step inherently introduces a variation in line width, i.e., variation of critical dimension CD, into the structure. The variation is typically from line to line within a circuit, chip, or wafer. The variation within a single line can also be significant. FIG. 1A schematically represents all types of line width variation.

After providing the patterned photoresists atop the gate structure, the pattern is transferred from the patterned photoresists into the hard mask 16 providing patterned hard masks 16a, 16b, and 16c. As is shown in FIG. 1B, the variation in critical dimension is still present in the structure after the first pattern transfer step.

To achieve microstructures having an ultra-sub-lithographic feature (about 0.7 F), the patterned hard masks 16a, 16, and 16c are typically trimmed by a conventional etching process such as an isotropic dry etch, e.g., a COR (chemical oxide removal) etch. Alternatively, an antireflective coating and/or resist itself can be trimmed during the hard mask etching step. Alternatively, the lines themselves can be trimmed during their etching. The later trimming process is often referred to as active trimming. Any combination of trimming processes leads to a sub-lithographic structure of final lines. For simplification of drawings, the trimming process is shown at the hard mask level. The structure formed after the patterned hard masks have been trimmed is shown, for example, in FIG. 1C. The patterned and trimmed hard masks are denoted as 16a', 16b' and 16c'. Note that the variation in critical dimension is still present in the structure after the patterned hard masks have been trimmed. Furthermore, the relative variation in CD with respect to the nominal or average CD increases with any known combination of trimming processes.

Following the trimming step, the pattern is transferred from the patterned and trimmed hard masks into the underlying gate conductor 14 using an etching process providing patterned gate conductors 14a, 14b, and 14c. After the second pattern transfer step, the patterned and trimmed hard masks are typically removed providing the structure shown, for example, in FIG. 1D. The prior art gate microstructure shown in FIG. 1D also has a variation in CD.

The variation in CD that results from this prior art process is typical about 30% (6 σ, where σ is a standard deviation parameter or range). FIG. 2 shows a typical distribution of the CD variation for the prior art gate microstructure shown in FIG. 1D. Such a high variation in CD is unwanted since it does not permit reliable fabrication of ultra-sub-lithographic features. Additionally, the high variation in CD is unwanted since it hinders device performance and manufacturing yield and results in a substantial increase of power dissipation.

In view of the drawbacks associated with the prior art process of producing microstructures with ultra-sub-lithographic features, there is a need for providing a new and improved method that is capable of fabricating microstructures that have ultra-sub-lithographic features and a reduced CD variation preferably of less than 10% (6 σ or range).

SUMMARY OF THE INVENTION

One object of the present invention is to provide a method of reducing the line width to below the lithographic limit such that the method has a self-correcting property. The term "self-correcting property" denotes that the width of the wider line is reduced or trimmed faster than that of the thinner line. Accordingly, the line width variation parameter can be tightened to below the limit defined by conventional photolithography, etching, or deposition.

Another object of present invention is to provide an etching method suitable to trim lines of less than about 100-nanometer wide.

A further object of present invention is to provide a structure comprised of a plurality of trimmed lines such that both the variation of line width and the variation of the distance in between adjacent lines are below the respective limits defined by photolithography.

These and other objects and advantages are achieved in the present invention by utilizing a self-correcting etching (SCORE) process. The SCORE process of the present invention is particularly useful for reducing preselected features of a hard mask without degrading the variation of the critical dimension (CD) within each wafer. Alternatively, the CD variation of the hard mask features' produced during printing can be substantially reduced by applying SCORE. Hence, ultra-sub-lithographic features (e.g., nanostructures) can be reliably fabricated. Consequently, the method of the present invention can be used to increase the circuit performance, while improving the manufacturing yield and reducing power consumption.

In addition, a unique collection of nanostructures (including nanocircuits) is disclosed. The nanocircuit of the present invention has a plurality of ultra-sub-lithographic features (less than 0.7 F, where F is the minimal lithographic dimension related to the wavelength of exposure light/beam) with CD variation of less than 10% (6 sigma or range). In one embodiment of the present invention, such integrated nano-circuits represent an ultra-high performance logic circuit such as a microprocessor or a digital signal processor.

As indicated above, one aspect of the present invention relates to a method of fabricating a microstructure comprising the steps of:

providing a structure comprising a multi-layered stack located atop an etchable material, said multi-layered stack comprising a core material including at least one diffusing element located between top and bottom diffusion barrier layers;

patterning the multi-layered stack to provide a plurality of patterned multi-layered stacks on the etchable material, each patterned multi-layered stack having etched facets;

heating the patterned multi-layered stacks to cause lateral diffusion of the at least one diffusing element to the etched facets;

removing the at least one diffusing element from the etched facets;

optionally, covering a subset of patterned features with a block mask to expose only a plurality of select lines;

performing a self-correcting dopant-sensitive etching process on a plurality of exposed patterned multi-layered stacks to provide patterned lines that have a substantially reduced line width and substantially reduced line width variation; and optionally, etching the underlying etchable material using the patterned lines as an etch mask thereby providing a plurality of microstructures each having ultra-sub-lithographic features, and substantially the same line width.

The present invention also relates to a microstructure that is fabricated by the inventive method. Specifically, and in broad terms, the microstructure comprises:

a plurality of one-dimensional structures which satisfy criteria (1) and (2)(to be defined subsequently herein), each having a critical dimension L that it is less than a minimal feature size F obtainable by lithography or any other patterning, etching, deposition, or shaping technique, wherein the plurality of structures have a variation in critical dimension that is less than the $\Delta L \cdot F/L$, where $\Delta L$ is the range of critical dimension variation obtainable by lithography or any other patterning, etching, deposition, or shaping technique which form microstructures with minimal feature size F.

DETAILED DESCRIPTION OF THE INVENTION

Figure 1A:
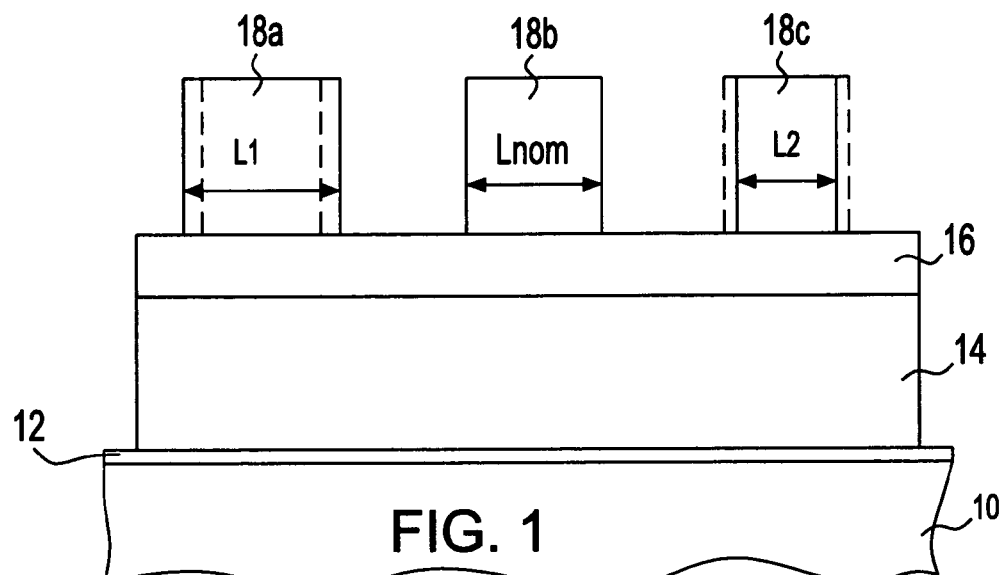
FIGS. 1A–1D are pictorial representations (through cross sectional views) illustrating the prior art process of fabricating gate microstructures having ultra-sub-lithographic features.
Figure 1B:
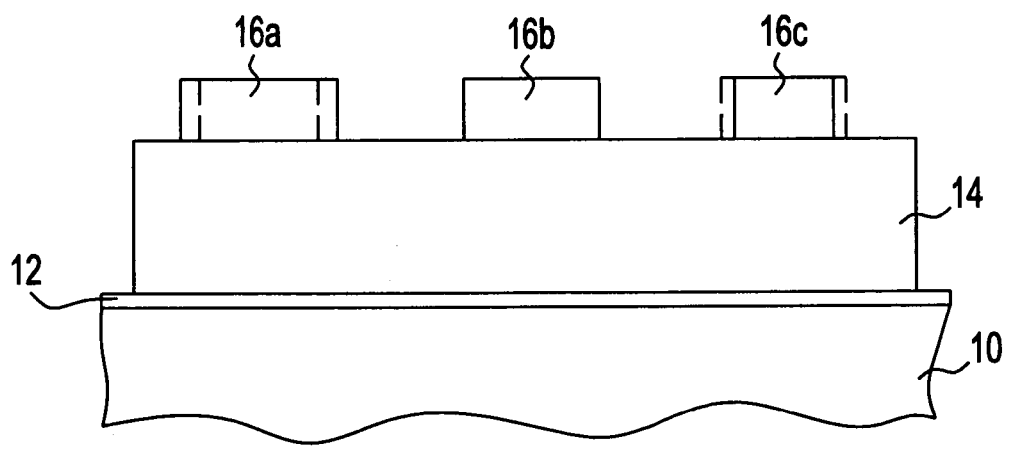
Figure 1C:
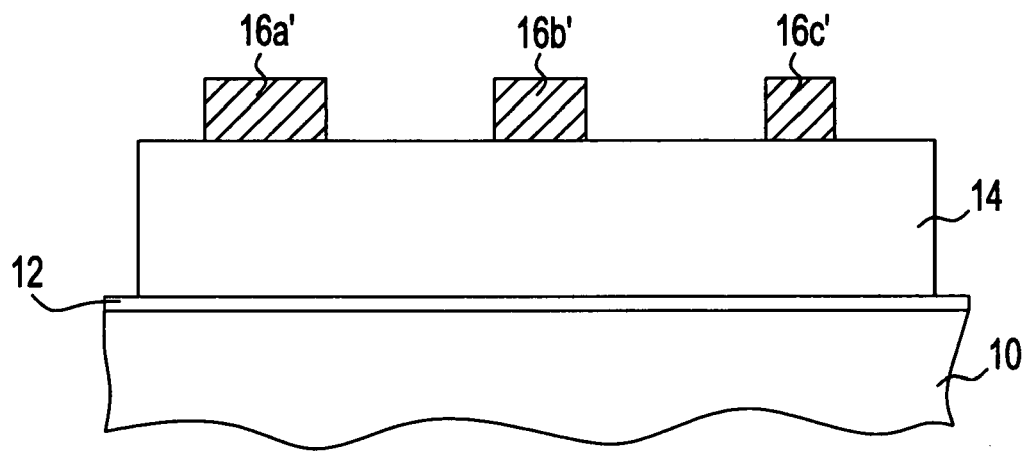
Figure 1D:
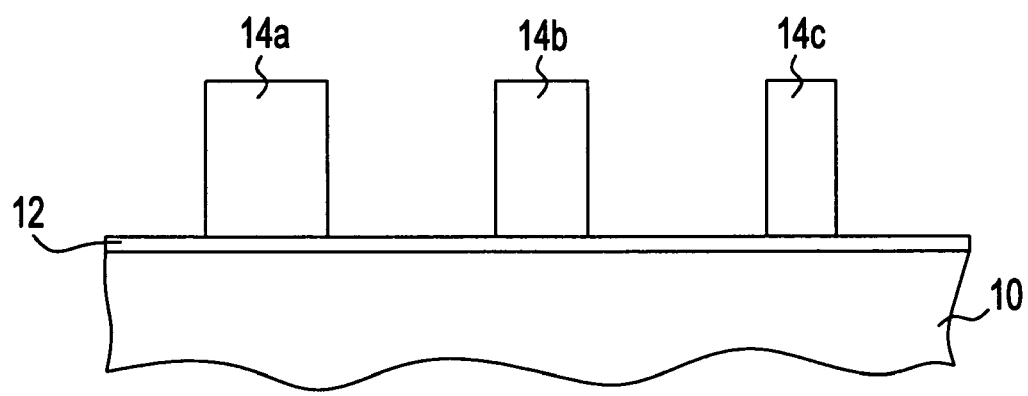

The present invention, which provides a method of fabricating structures having ultra-sub-lithographic features (less than 0.7 F) and the resultant structures formed therefrom, will now be described in greater detail by referring to the drawings that accompany the present application. In the accompanying drawings, like and corresponding elements are referred to by like reference numerals.

Referring to FIGS. 3A–3J, there is shown one possible implementation of the present invention for fabricating gate microstructures. Although the drawings and description that follow are specific for the formation of gate microstructures, the present invention may be used in fabricating any microstructure provided that the microstructure includes at least one etchable material.

Figure 3A:
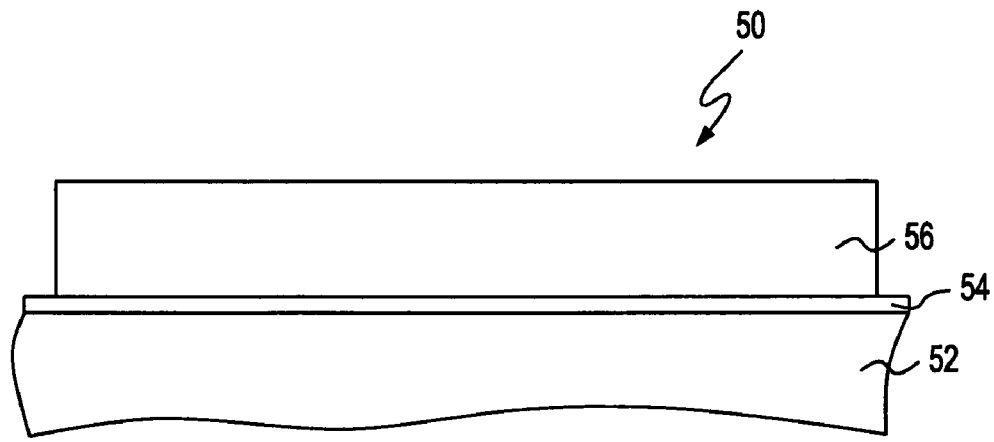
FIGS. 3A–3J are pictorial representations (through cross sectional views) illustrating the basic processing steps of the present invention used in forming gate micro structures.

Referring to FIG. 3A, there is shown an initial structure 50 that may be employed in the present invention. The initial structure 50 includes a semiconductor substrate 52, a gate dielectric 54 located on a surface of the semiconductor substrate 52 and a gate conductor 56 located on the gate dielectric 54. The semiconductor substrate 52 of the initial structure 50 includes any semiconducting material including, but not limited to: Si, SiGe, SiC, SiGeC, GaAs, InAs, InP or other like III/V compound semiconductors. The semiconductor substrate 52 may also comprise a multilayer structure in which at least the top layer thereof is semiconducting. Illustrative examples of multilayer structures include, for example, Si/SiGe, a silicon-on-insulator (SOI) or a SiGe-on-insulator (SGOI). The semiconductor substrate 52 may also comprise various useful structures such as memory cells, isolation structures (e.g., isolation trenches), dopant wells, three dimensional transistor features such as fins and pillars, and buried contacts and interconnects.

The gate dielectric 54 is formed on a surface of the semiconductor substrate 52 by deposition or thermal oxidation, nitridation or oxynitridation. Combinations of the aforementioned processes may also be used in forming the gate dielectric 54. The gate dielectric 54 is comprised of an insulating material including, but not limited to: an oxide, nitride, oxynitride or any combination thereof.

A highly preferred insulating material that is employed in the present invention as the gate dielectric 54 is nitrided $SiO_2$ or oxynitride. Although it is preferred to use nitrided $SiO_2$ or oxynitride as the gate dielectric material, the present invention also contemplates using insulating materials, i.e., dielectrics, which have a higher or lower dielectric constant, k, than nitrided $SiO_2$. For example, the gate dielectric 54 may comprise a oxynitride-nitride stack, a pure nitride, a high-k oxide or oxynitride or respective silicate such as $Al_2O_3$, $HfO_2$, $HfO_xN_y$, $HfSi_xO_yN_z$, or a perovskite-type oxide.

The physical thickness of the gate dielectric 54 may vary, but typically the gate dielectric 54 has a thickness from about 0.5 to about 20 nm, with a thickness of from about 1.0 to about 10.0 nm being more highly preferred.

After forming the gate dielectric 54, a gate conductor 56, which represents one type of etchable material that can be used in the present invention, is formed on at least the exposed upper surface of the gate dielectric 54. The gate conductor 56 is comprised of a conductive material including, but not limited to: elemental metals such as W, Pt, Pd, Ru, Re, Ir, Ta, Ti, Al, Mo or combinations, including alloys, and multilayers thereof; silicides and nitrides of the foregoing elemental metals; polysilicon either doped or undoped; or combinations and multilayers thereof. One highly preferred conductive material employed as the gate conductor 56 is doped polysilicon.

The gate conductor 56 is formed utilizing a deposition process such as CVD, plasma-assisted CVD, sputtering, evaporation, chemical solution deposition or plating. When metal silicides are employed, a conventional silicidation process may be used in forming the same. On the other hand, when doped polysilicon is employed as the gate conductor 56, the doped polysilicon may be formed by an in-situ doping deposition process, or alternatively, a layer of undoped silicon is first deposited and thereafter an ion implantation process is employed in doping the undoped polysilicon. The doping of the undoped polysilicon may occur immediately after deposition or in a later processing step. The material layers present in gate conductor layer 56 can be in either amorphous, single-crystal, or polycrystalline form.

The physical thickness of the gate conductor 56 formed at this point of the present invention may vary depending on the conductive material employed as well as the process used in forming the same. Typically, however, the gate conductor 56 has a thickness from about 20 to about 400 nm, with a thickness from about 50 to about 200 nm being more highly preferred.

Figure 3B:
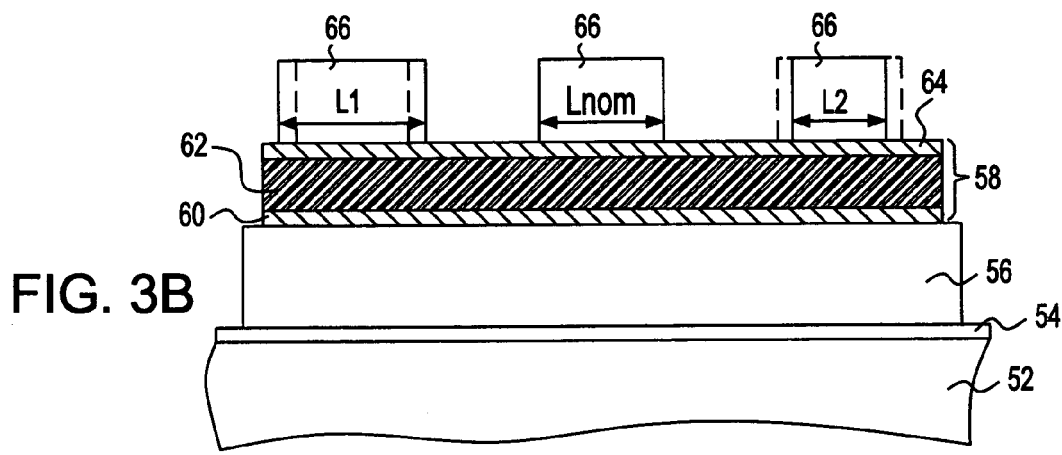

In order to achieve the self-correcting property of the present invention, a multi-layered stack 58 is formed atop the initial structure 50 of FIG. 3A. The multi-layered stack 58, see FIG. 3B, is comprised of a core material 62, which is located between two thin diffusion barriers 60 and 64, respectively.

The core material 62 may comprise various elements with the proviso that at least one element of the core material 62 can diffuse through the core material 62 at an elevated temperature. For instance, the core material 62 may include one of the commonly used doped glasses, such as fluorinated-doped silicate glass (FSG), phosphorus-doped silicate glass (PSG), boron-doped silicate glass (BSG), boron-and phosphorus-doped silicate glass (BPSG), nitrogen-doped glass, or carbon-doped glass wherein the diffusing element is the dopant (e.g., F, P, B, N, or C). Alternatively, the core material 62 may be silicon that is doped with P or As, for example, or a polymer-based material that is doped with a fast diffusion element (typically a metal ion) such that the polymer-based material can withstand the minimal thermal budget of depositing the top diffusion barrier 64. The core material 62 is formed using a conventional deposition process including, for example, spin-on coating, chemical vapor deposition, plasma-assisted chemical vapor deposition, atomic layer deposition, chemical solution deposition or evaporation. The dopant may be introduced by an in-situ doping deposition process, or alternatively, a core material 62 is first deposited with or without the dopant and thereafter any other doping process such as an ion implantation or gas phase doping is employed to add the dopant to the core material 62.

The diffusion barriers 60 and 64 can be deposited at a relatively low temperature of about 100° C.–300° C. by employing known low-temperature deposition techniques such as, for example, atomic layer deposition (ALD) and/or excitation assisted depositions such as plasma-assisted processes. The thickness range of the core material 62 is from about 10 nm to about 150 nm, with a thickness range from about 20 nm to about 100 nm being more highly preferred. The typical dopant concentration range in the core material 62 is from about $10^{17}$ $cm^{-3}$ to about $10^{22}$ $cm^{-3}$, with the dopant concentration range from about $10^{19}$ $cm^{-3}$ to about $5·10^{21}$ $cm^{-3}$ being more highly preferred.

The diffusion barriers 60 and 64 may be comprised of the same or different material that is capable of preventing the at least one diffusing element from diffusing vertically from the core material 62. Specifically, the diffusion barriers may comprise silicon nitride, a metal nitride, such as TiN, WN, TaN, or a respective oxynitride. The thickness of both diffusion barriers 60 and 64 is chosen such that the diffusion barrier layers are thick enough to block vertical diffusion of the at least one diffusing element of the core material 62 at a specified thermal budget. The preferred thickness range of diffusion barriers 60 and 64 thus depends on the specific thermal budget (to be defined below) and is from about 1 nm to about 20 nm.

Narrow lines and optional other structures are then formed atop the multi-layered stack 58 providing the structure shown, for example, in FIG. 3B. In particular, the patterned photoresist lines 66 are formed atop the top diffusion barrier 64 of the multi-layered stack 58. The photoresist lines 66 may be formed via photolithography.

Photolithography techniques may include various image enhancement methods such as phase shift masks, multiple exposures, and optical proximity correction. The line width variation is an inherent drawback of any line definition process. For the purpose of this invention, the applicants refer to the smallest line dimension (a critical dimension) as "line width" dimension. In this embodiment, the line width is related to the transistor channel length.

Figure 2:
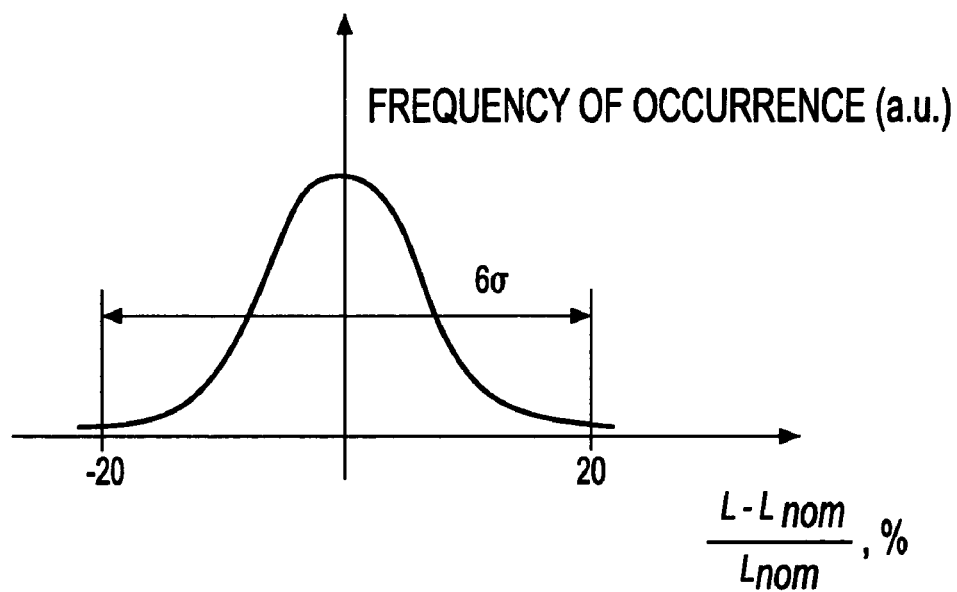
FIG. 2 is a graph illustrating a typical distribution of the CD variation for the gate microstructure shown in FIG. 1D. Frequency of occurrence (arbitrary units) is plotted on the y-axis, while $(L-L_{nom})/L_{nom}(\%)$ is plotted on the x-axis.

FIG. 3B schematically shows such random line width variation by drawing three different lines with nominal, smaller $L_2$, and larger $L_1$ width. In practical examples, the line width varies randomly across the chip or wafer and can be represented by a probability density function such as shown, for example, in FIG. 2. The experimental probability density function can be often fitted with a Normal probability distribution function with a characteristic parameter σ, i.e., sigma, also known as the standard deviation.

Figure 3C:
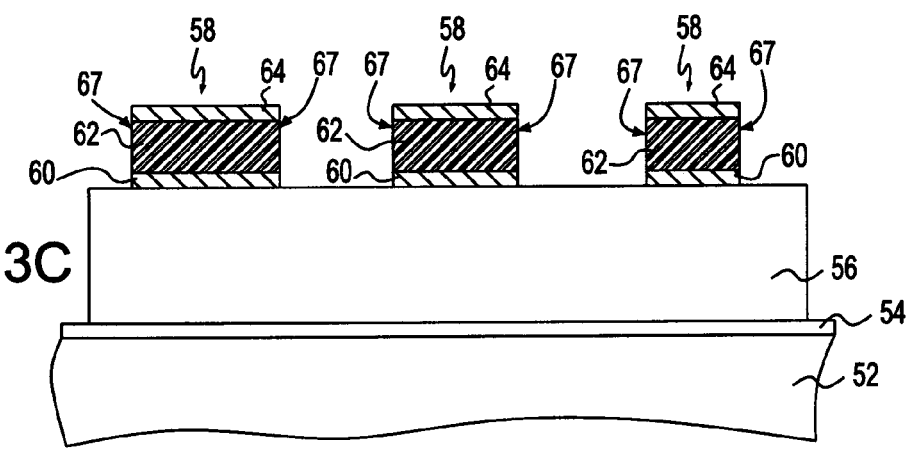

Next, a patterning step which includes a pattern transfer etching process is used to transfer the pattern, i.e., lines, from the patterned photoresist into the multi-layered stack 58. The pattern transfer may include a simple dry etching process such as reactive ion etching. In some embodiments, the pattern transfer etching process may also comprise line trimming including self-limiting trimming. After pattern transfer and removal of the photoresist lines 66 have been performed, the structure shown, for example, in FIG. 3C is formed. Note that the same line width variation as that of the resist lines 66 is transferred to each of the patterned multi-layered stacks 58. Such one-to-one transfer of line width is not typical and shown here only to simplify drawings. In general, any conventional etching process increases the variation of the line width. Furthermore, the line width control is even more difficult when the nominal line width is close to the resolution limit of photolithography.

In the trimming process, the mask lines are uniformly etched to yield smaller lines. While any known trimming process provides a method for reducing nominal line width, it increases the line width variation with respect to the nominal line width. In general, the line width control becomes much more difficult for ultra narrow lines. In the inventive method, the transferred line patterns are defined via known techniques and, consequently, have a relatively large variation at this step of the present invention.

After pattern transfer into the multi-layered stack 58 (including diffusion barrier layers 60 and 64 and core material 62), the structure shown in FIG. 3C is subjected to a heating step having a specific thermal budget to cause the diffusion of the at least one diffusing element within the core material 62. The thermal budget of this process is defined via the characteristic diffusion length of diffusing element $L_d$ which is related to the process temperature and the process time. Specifically, per a given diffusing element in a given core material 62, the characteristic diffusion length of diffusing element $L_d$ is uniquely related to the process temperature T and the process time $\tau$ as $L_d=(D\tau)^{0.5}$, where D is the element diffusivity in the core material 62 at a given process temperature T.

Accordingly, the process temperature and time are selected such that the characteristic diffusion length $L_d$ is within a preferred range specified below. In one example, the process temperature T is chosen from a range supported by commercially available heating equipment, i.e., from about 100° C. to about 1200° C., and the process time is adjusted to get an acceptable value of characteristic diffusion length $L_d$. The process time is typically selected to be much longer than the duration of any transient processes such as wafer temperature ramp-up and ramp-down. The process temperature is typically selected to be substantially low not to cause any thermal damage to any of the features present in the substrate and the inventive stack and to be substantially high to result in the characteristic diffusion length $L_d$ of the order of the nominal line width $L_{nom}$ within a reasonable anneal duration of less than several hours. Because the diffusion barriers 60 and 64 prevent the movement of diffusing element, i.e., dopant, in the vertical direction, the diffusion process becomes substantially one-dimensional in the horizontal direction. The diffusing element typically diffuses from the center portion to the etched facets 67, i.e., sidewalls, of the patterned multi-layered stacks 58 and then it is removed from the exposed surfaces. While, for a casual observer, it may appear that the processes of diffusion and facet surface removal are happening simultaneously, for a given diffusing atom, these processes are happening in series: first, diffusion to the facet and, then, removal from the facet surface. The dopant surface removal process can be beneficially made faster than the diffusion process within the core material 62 such that the overall rate is diffusion limited.

In one embodiment (see, FIG. 3D), the dopant surface removal process comprises a process of evaporation of the dopant into gaseous phase that surrounds the structure. The evaporation process is schematically shown by arrows 68 in FIG. 3D and the change in shading denotes less dopant present near the facets 67. The evaporation process rate can be increased by lowering the ambient pressure or by conducting thermal treatment in a reactive ambient such that the dopant reacts with the gas species at the exposed surfaces to form volatile products. In a neutral ambient, the preferred pressure range is from about 0.00001 mTorr to about 800 Torr. In a reactive ambient, the preferred pressure range is from about 0.1 mTorr to about 10000 Torr. In one example, the reactive ambient is comprised of hydrogen, halogens (e.g., fluorine or chlorine), or oxygen such that respective molecules react with the diffusing dopants to form volatile dopant-$H_x$, dopant-halogen, or dopant-$O_y$ molecules, respectively.

For some core materials 62 such as silicon, the etched facets 67 should be kept clean to prevent formation of unwanted surface layers such as native oxides which may slow down dopant removal from the facets. In one example, the diffusion element is phosphorus and the core material 62 is silicon. In this example, and in order to speed up the evaporation of phosphorus from the etched facets, the facets are cleaned directly prior to the heating step in a solution comprised of hydrofluoric acid to remove any native or chemical oxide present on the facet surfaces.

The heating step is conducted in a reducing ambient (e.g., hydrogen ambient at a reduced pressure of from about 1 Torr to about 300 Torr, with from about 10 Torr to about 200 Torr being more highly preferred) to remove any oxide residue still present at the facet surfaces.

In the above examples, the reactive ambient can be also be comprised of respective radicals or ions rather than molecules. The radicals or ions can be produced with some form of excitation. The excitation may include direct or remote electrical discharges, intense electromagnetic radiation including infrared, visible, ultraviolet, and X-ray portions of spectrum, intense remote heat, electron or ion beams, and chemical processes including decomposition of unstable molecules and multi-step reactions.

In another embodiment (see, FIG. 3E), the dopant surface removal process comprises a process of diffusion into, accumulation within, or gettering by another material 80 (hereinafter the getter material 80) placed in between and atop the etched lines, i.e., patterned multi-layered stacks. As shown in FIG. 3E, the getter material 80 is placed in between and atop the etched lines after the line definition process. The getter material 80 can be deposited by any known method such as, for example, chemical vapor deposition, spin-on coating, plating, or sputtering techniques. The getter material 80 comprises any material that has the ability to quickly accumulate the diffusing element from the core material 62.

After the getter material 80 is deposited, the structure is subjected to a specified thermal budget, i.e., heating step, causing the selected dopant to diffuse from the core material 62 into material 80. The direction of dopant diffusion and removal is shown by arrows 68. Because the speed of diffusion and accumulation of the dopant in the getter material 80 is much faster than the speed of the dopant diffusion within the core material 62, the rate of dopant removal from the boundary of the core material 62 is much faster than the characteristic rate of diffusion within the core material 62. Therefore, the overall rate of the dopant transfer process is diffusion limited within the core material 62. After the dopant removal process, the getter material 80 is removed selective to diffusion barriers 60 and 66 as well as the core material 62.

Figure 4:
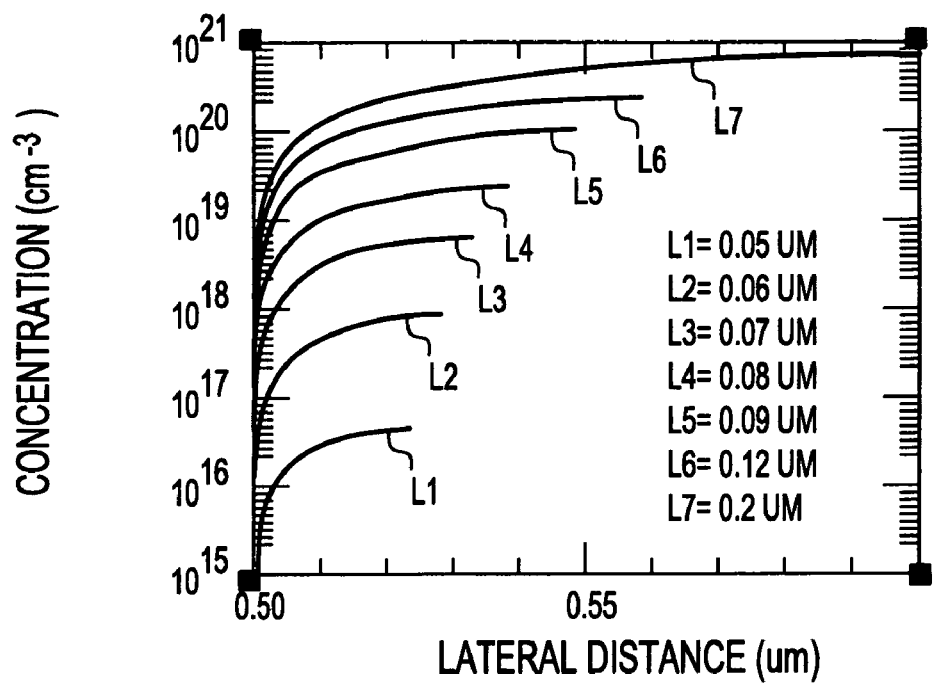
FIG. 4 is a plot of the lateral dopant profile after an evaporation anneal for various line widths L; the y-axis is concentration ($cm^{-3}$), while the x-axis is lateral distance ($\mu m$).
Figure 5:
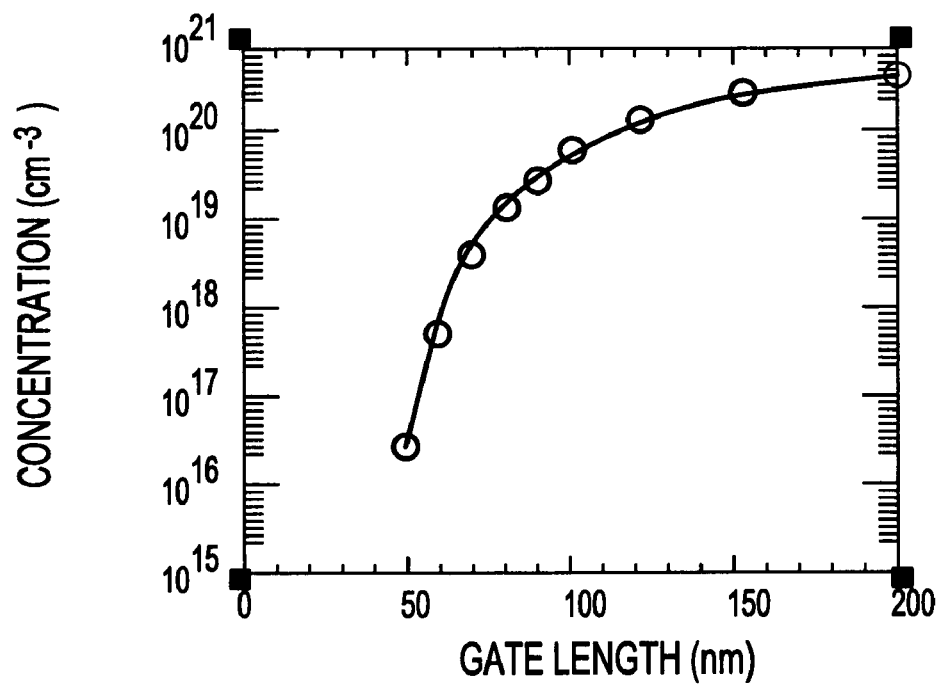
FIG. 5 is a plot of average concentration remaining in the film after annealing; the y-axis is concentration ($cm^{-3}$), while the x-axis is gate length (nm).
Figure 6:
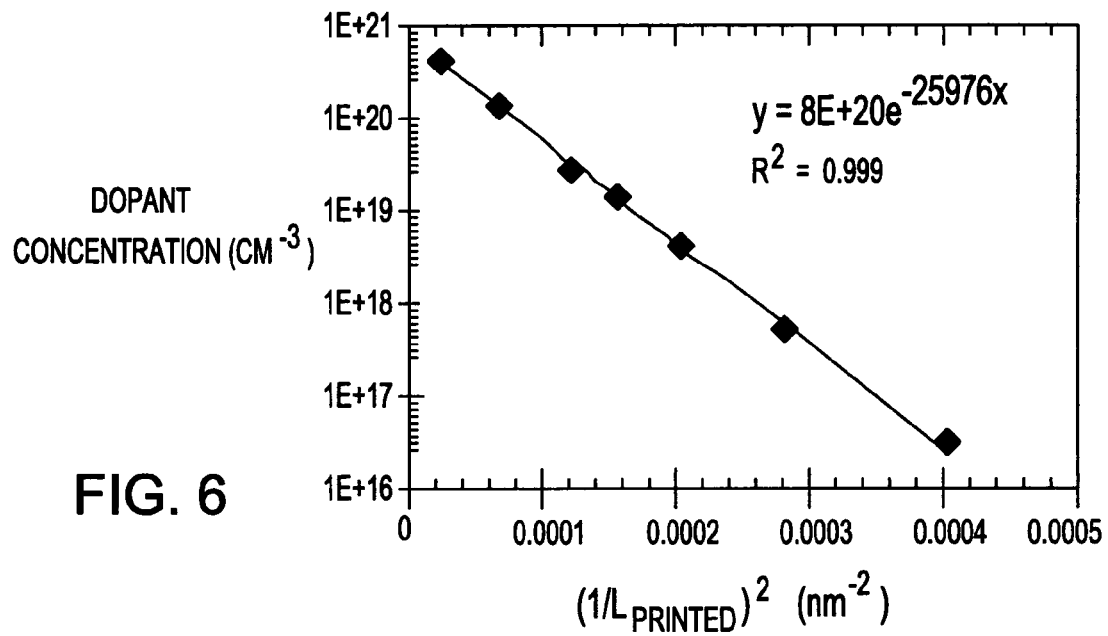
FIG. 6 is a plot of dopant concentration ($cm^{-3}$) vs. $(1/L_{printed})^2 (nm^{-2})$.

When subjected to a specified thermal budget, the etched lines, i.e., the patterned multi-layered stacks, lose dopant at the etched facets 67. The dopant loss is highly sensitive to the line width; wider lines lose less dopant than thinner lines. FIGS. 4–6 demonstrate dopant loss sensitivity to the line width. The dopant profiles are found in a half portion of the line through a numerical solution of one-dimensional diffusion equation with the following boundary conditions: zero diffusion current at the point of symmetry (line center) and zero dopant concentration at the line sidewall. The latter boundary condition is due to the diffusion-limited nature of the process. The diffusion parameters are taken for phosphorous in polycrystalline silicon. The initial concentration of dopant in the core material 62 is taken to be about $8\cdot10^{20}$ cm$^{-3}$. The thermal budget was selected such than the characteristic diffusion length is equal to about half of the nominal line. The nominal line is set to be at about 100 nm. The dopant profiles are calculated for different lines with width varying from about 200 nm to about 50 nm. The result of such numerical experiment is shown in FIG. 4. It is noted that while the line width varies by a factor of four, the resultant doping level varies by about a factor of ten thousand (4 orders of magnitude). The amount of dopant loss is achieved in the present invention by comparing the amount of at least one dopant removed from the edged facets to that which was originally present therein.

FIG. 5 shows the average concentration of dopant remaining in the line as a function of line width. FIG. 6 shows that the curve shown in FIG. 5 is an exponential function of squared line width. Note that the average dopant concentration shown in FIGS. 5 and 6 depends linearly on the initial dopant concentration while it is a very strong function (exponential of a square) of the line width and characteristic diffusion length. Subsequently, the remaining dopant concentration is also a weak function of the thickness of the core material 62.

The key findings of the numerical experimentation can be summarized as follows:

The average dopant concentration in the line is higher for wider lines and smaller for thinner lines;

If the dopant removal process is diffusion limited, it results in a strong dependence of the remaining dopant concentration on the line width and a weak dependence on the initial dopant concentration and, consequently, the thickness of the core material 62;

If the dopant removal process is surface-extraction limited, it results in a weak dependence of the remaining dopant concentration on line width, thickness of the core material 62, and initial dopant concentration;

The thermal budget of the dopant removal process is selected such that the characteristic diffusion length $L_d$ ($L_d = (D\tau)^{0.5}$, where D is the dopant diffusivity in the core material 62, and $\tau$ is the process time, is from about one tenth of the nominal line width to about 10 times of the nominal line width.

While the numerical experiment has been carried out for a specific example of the core material 62, the key conclusions are valid for any core material 62 provided that it has at least one diffusing element which is removed from etched facets. Because of the strong dependence of the remaining dopant concentration on the line width and a weak dependence on the thickness of the core material 62 and/or initial dopant concentration, the diffusion-limited dopant removal process is highly preferred. The thermal budget range or the ranges of process temperature and process time are selected to result in the preferred range of characteristic diffusion length of dopant removal process. The characteristic diffusion length range from about one forth of the nominal line width to about the nominal line width is highly preferred, for the remaining dopant concentration is most sensitive to the line width in this range.

The non-uniform dopant profiles of FIG. 4 are not desirable. Flat dopant profiles are highly preferred to ease the self-correcting etch process control. Therefore, a series of optional steps are added to make the dopant distribution uniform. Although these steps are not required, they are highly desirable. After dopant removal step and removal of the optional getter material 80, a thin diffusion barrier 82 is formed on the sides of the lines, i.e., patterned multi-layered stacks 58, providing the structure shown, for example, in FIG. 3F. Diffusion barrier 82 can be made from the same material as diffusion barriers 60 and 64 or it can be made from a different material. In the former case, the thickness of diffusion barriers 60 and 64 should be larger than that of the sidewall diffusion barrier 82 such that the diffusion barrier 82 can be entirely removed with a timed etch while leaving a portion of the top diffusion barrier 64. In the latter case, the thickness of barriers 60, 64 and 82 can be chosen independently provided that there is a highly selective etch for the removal of diffusion barrier 82 with little affect on diffusion barriers 60 and 64 and the core material 62.

Figure 7:
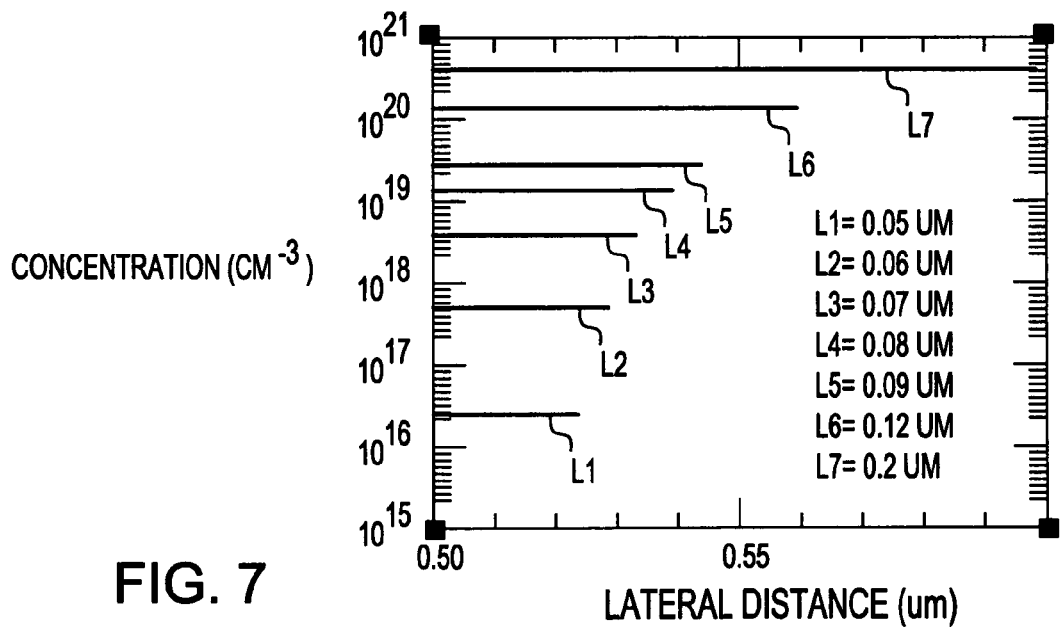
FIG. 7 is a plot of the lateral dopant profile after a flatting anneal for various line widths L; the y-axis is concentration ($cm^{-3}$), while the x-axis is lateral distance ($\mu m$).

After depositing the diffusion barrier 82, the structure is subjected to a thermal treatment to flatten the dopant profile within the patterned lines. Such a procedure has been simulated numerically for the condition of the above example and the result is shown in FIG. 7. The dopant profile is flat for each of the lines and the dopant concentration is equal to the average dopant concentration used in FIGS. 4 and 5. The set of patterned lines of provided in FIG. 3F is substantially different from that of the patterned lines in the previous drawings because a uniform dopant concentration in the core material 62 is a function of line width. In FIG. 3F, the wide line on the far left has much more dopant as compared to a thinner lines to the right.

Figure 3D:
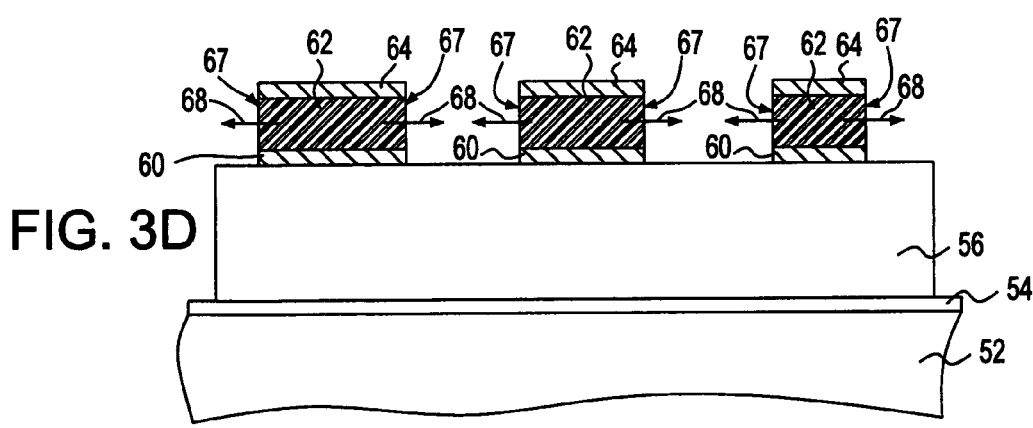
Figure 3E:
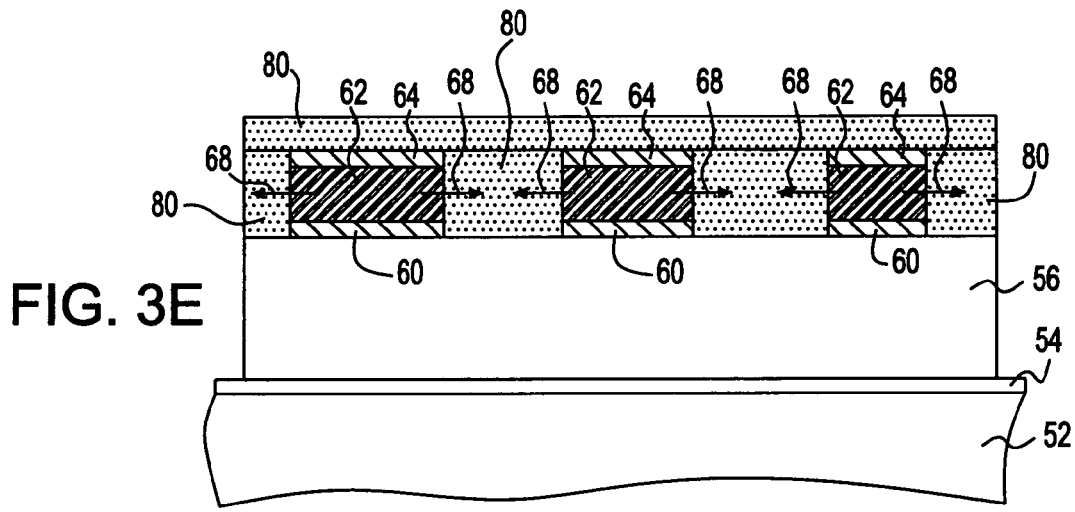
Figure 3F:
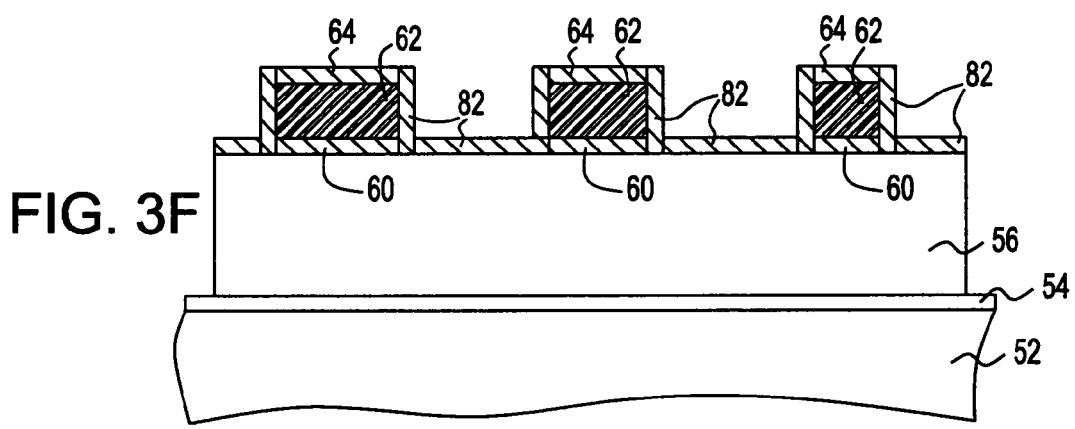
Figure 3G:
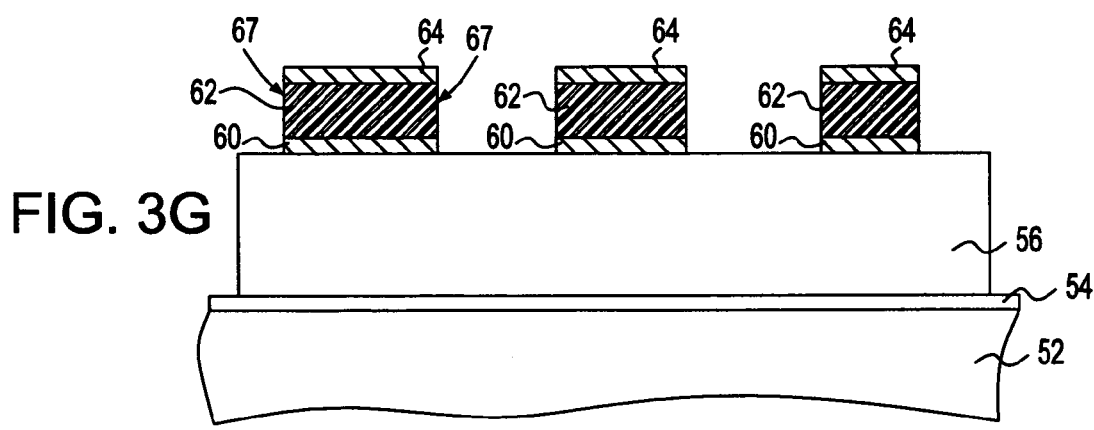

Next, the sidewall diffusion barrier 82 is removed from the structure to expose the sidewalls, i.e., etched facets 67, of the core material 62; see FIG. 3G. The removal process can be carried out using an isotropic dry or wet etching techniques. The etching mixtures are selected to be substantially inert to the core material 62.

Figure 3H:
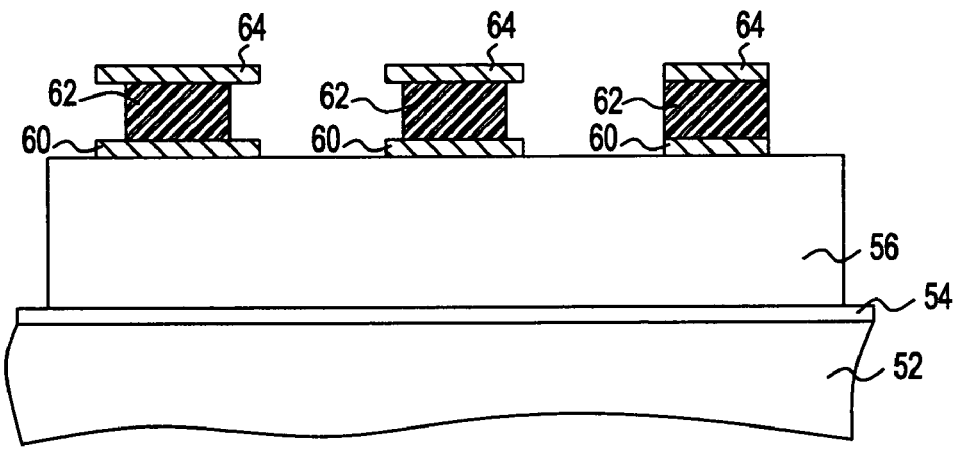
Figure 9:
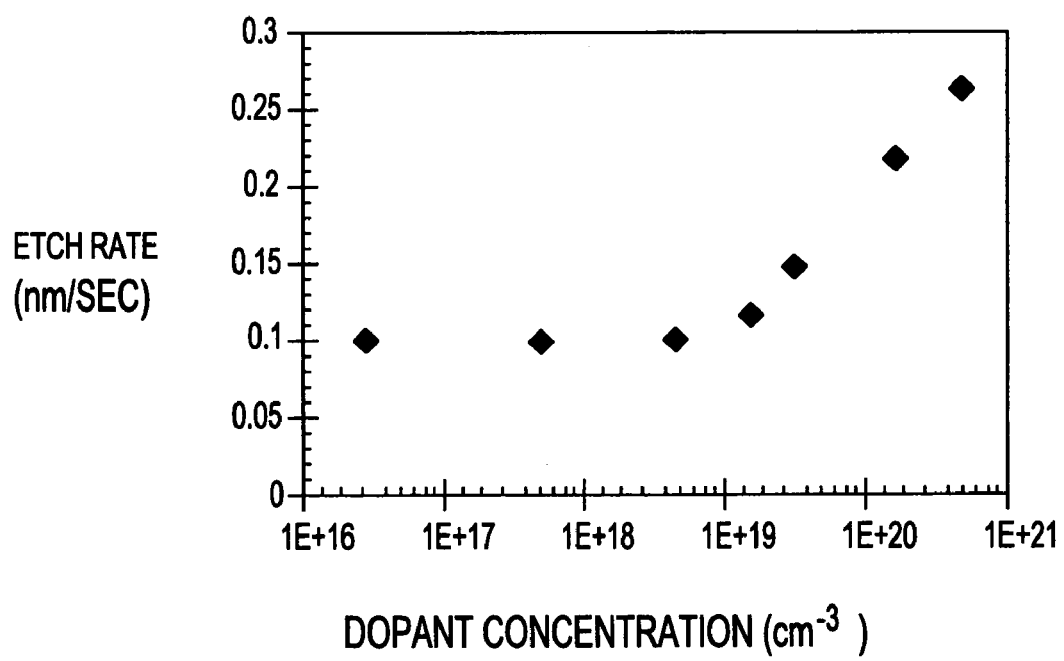
FIG. 9 is a graph of etch rate (nm/sec) vs. dopant concentration ($cm^{-3}$).
Figure 10:
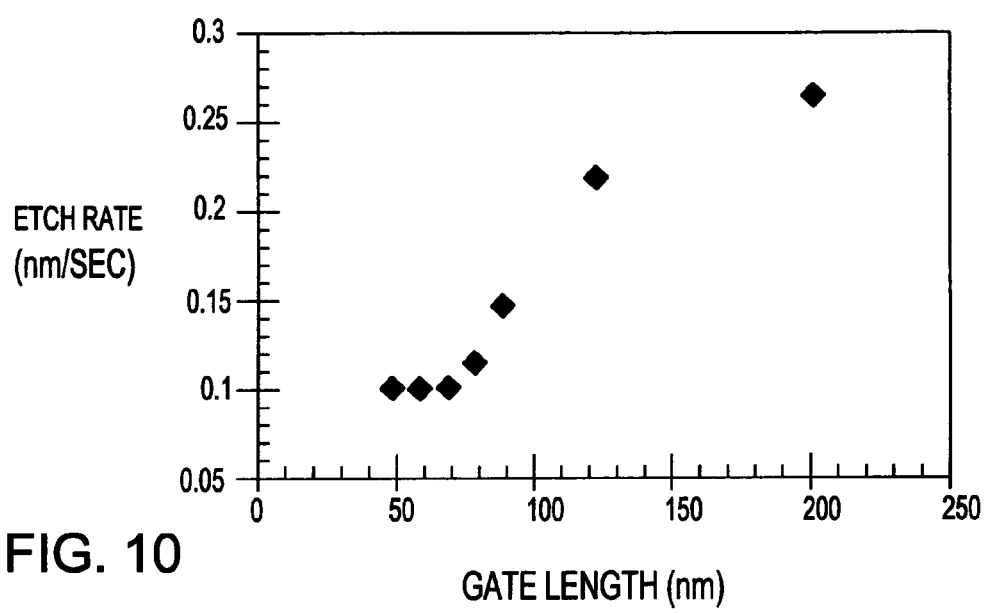
FIG. 10 is a graph of etch rate (nm/sec) vs. gate length (nm).

Next, a self-correcting etch of the core material 62 is used to reduce the line width variation of the patterned lines shown in FIGS. 3D, 3E or 3F. This is schematically shown in FIG. 3H. The self-correcting etch is a slow isotropic etch with the etch rate sensitive to the doping level of the core material 62. Specifically, the self-correcting etch removes highly doped core material faster than lightly doped core material. A typical etch rate dependence on the dopant concentration is shown in FIG. 9. As shown in FIG. 9, etch rate is a logarithmic function of dopant concentration above some certain threshold concentration of dopant. The threshold dopant concentration is typically about $10^{19}$ cm$^{-3}$. The etch rate below the threshold and its sensitivity to the dopant level above the threshold both depend on specific adjustable parameters of the etching mixture. Accordingly, the etch rate can be adjusted by modifying active chemical dilution ratio, process temperature, solution acidity (pH) in the case of wet etch, and ambient pressure in the case of dry etch.

Figure 11:
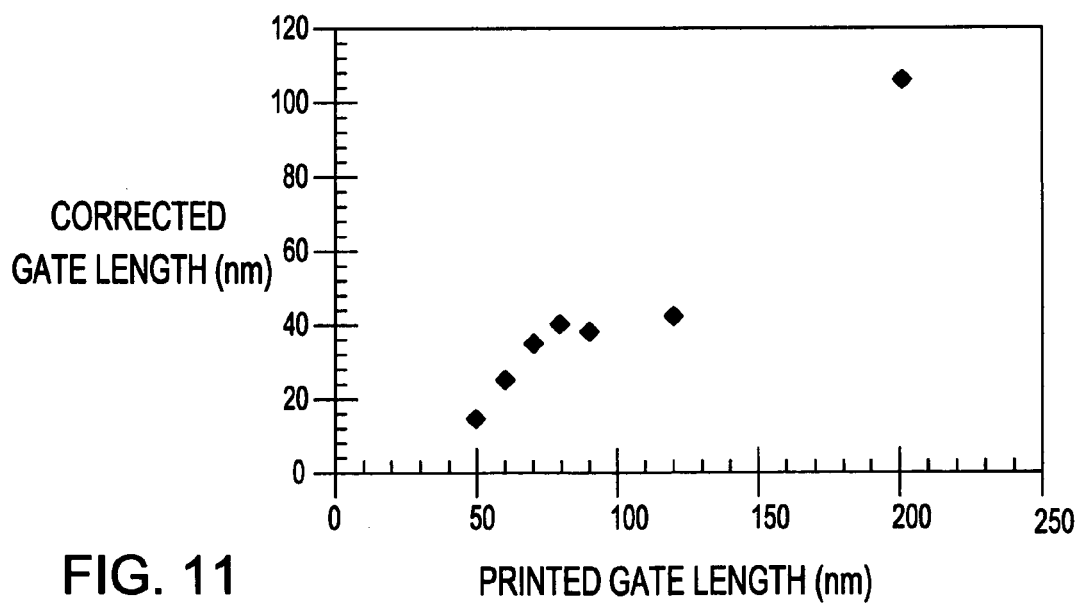
FIG. 11 is a graph of corrected gate length (nm) vs. printed gate length (nm).

A dopant-sensitive chemical conversion process can also be a part of the self-correcting etching or trimming process. In such process, the core material 62 is chemically altered with the rate sensitive to the doping level and then the altered material is etched away. In one example, the core material 62 is doped silicon and the chemical conversion reaction is an oxidation reaction. In addition, the introduction of chemical inhibitors or catalysts can be employed to alter the etch rate and its sensitivity to the dopant. The functional dependence of the etch rate on the dopant concentration can be made stronger than the typical logarithmic dependence. For instance, the dopant of the core material 62 can be a catalyst of the etching reaction resulting in a strong (polynomial) dependence of the etch rate on the amount of dopant. Such very sensitive etches are desirable for correcting lines with a weak dopant variation such as the case of surface-extraction limited dopant removal process described above. Typical logarithmic etch is well suited for correcting lines with a strong dopant variation such as the case of diffusion-limited dopant removal process described above. FIG. 11 shows corrected line width (width of etched core material 62) as a function of the original line width in the case of the logarithmic etch of FIG. 9 applied to the lines with the dopant distribution shown in FIG. 8. Printed lines with nominal width of about 100 nm and the variation range of +/−20 nm are corrected to form a line set with nominal width of about 40 nm and the variation range of +/−4 nm.

Figure 8:
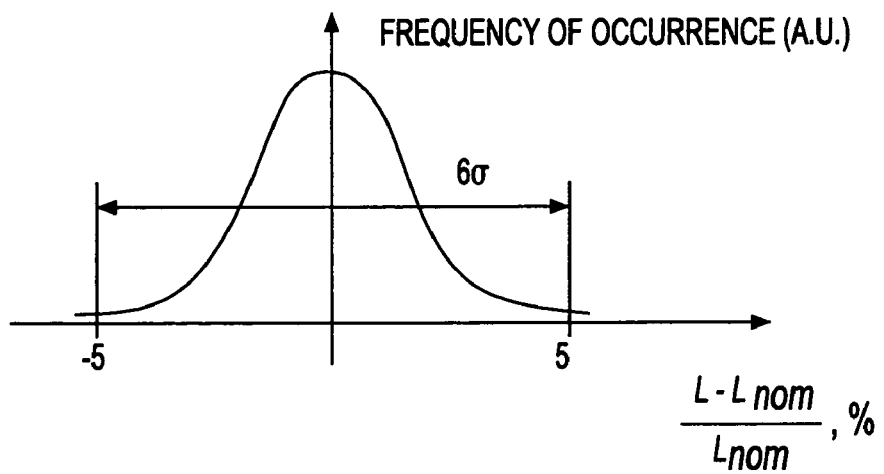
FIG. 8 is a graph illustrating a typical distribution of the CD variation for the gate microstructure shown in FIG. 3J. Frequency of occurrence (arbitrary units) is plotted on the y-axis, while $(L-L_{nom})/L_{nom}(\%)$ is plotted on the x-axis.

Accordingly, the applicants of the present application have obtained a unique set of trimmed lines with the nominal line width reduced by a factor of 2.5 and the line width variation as measured by the standard deviation or range (relative to the nominal line width) reduced by a factor of 2. A typical statistical distribution of line variation is shown in FIG. 8. Therefore, the inventive method allows for defining a plurality of narrow lines with the nominal width of $F/\alpha$, where F is the minimal line width defined by a particular conventional line definition process (e.g., photolithography, imprint lithography, spacer image transfer lithography, etc.) and $\alpha(\alpha>1)$ is the line reduction factor, and the line width variation as measured by the standard deviation or range (relative to the nominal line width) much smaller than the line width variation of the original line definition process at F nominal width multiplied by the line reduction factor $\alpha$.

Figure 3I:
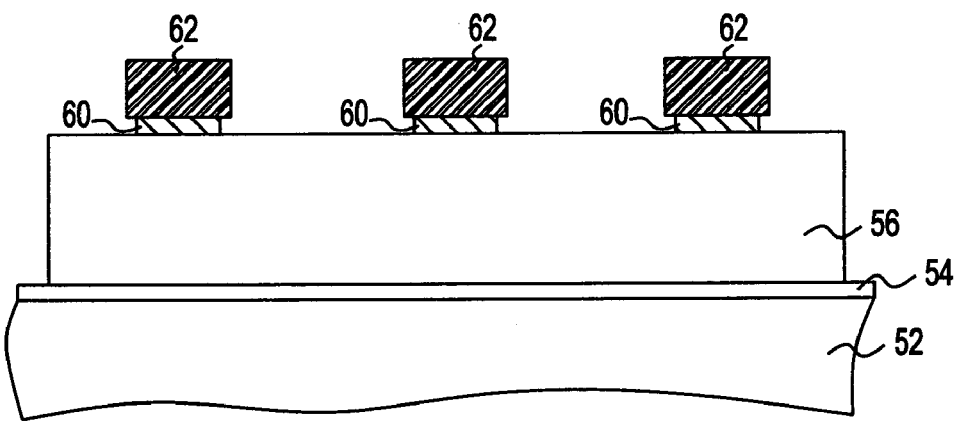
Figure 3J:
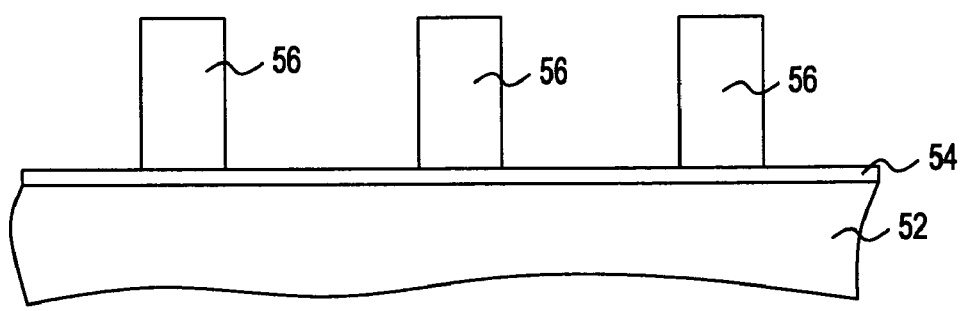

In the example of transistor gate definition process, the corrected lines are used as a hard mask for defining the gates from the gate conductor 56. Such line image transfer process can be accomplished using a directional etch such as a reactive ion etch. This process is shown in FIGS. 3I and 3J. The remains of diffusion barriers 64 can be optionally removed by either isotropic or directional etch prior to etching the core material 62. The removal process can be carried out using isotropic dry or wet etching techniques. The chemistry of diffusion barrier etch is selected to be inert to the core material 62. The gate conductor 56 is etched with a directional etch which is substantially selective to the core material 62. The gate conductor etch may include several steps with different etching chemistries to better control the sidewall profile and to stop on the gate dielectric 54. The final gate structure is shown in FIG. 3J where the mask structure of the present invention is omitted. According to the inventive method, the physical gate length (line width) variation of the final gate line is substantially improved.

The applicants also note that the described self-correcting technique can be employed to reduce the variation of spacing between two adjacent and parallel lines. In an ultra dense pattern of parallel lines, the lines are spaced at a minimal distance F. The variation of spacing between adjacent lines is due to both variation of distance between line centers (line center is a line middle point in the width direction) and variation of line width. Often, the variation of line width is a dominant component to the variation of spacing between adjacent lines. By using the inventive self-correcting method, the line width variation can be substantially reduced and, consequently, the variation of spacing between adjacent lines will be substantially improved and defined by the variation of distance between adjacent line centers.

The self-correcting property of the inventive method relies on the one-dimensional nature of the structure (set of lines) coupled with the one-dimensional nature of the diffusion process (the vertical diffusion is suppressed by the diffusion barriers 60 and 64). As long as such one-dimensional coupling exists between the structure and the self-correcting process, the inventive method can be applied to structures other than the mask structure for the set of lines. Furthermore, a set of complex structures can be divided into simpler structures suitable for trimming and correcting using the inventive method. Such division of complex structures can be accomplished by disposing a block mask prior to the self-correcting etch. This is illustrated in several examples. In addition, the requirements for the concept of one-dimensional coupling are quantified.

In one example, a set of small disks or cylinders represents a one-dimensional structure similar to that of the set of lines. The structure is completely defined by only one parameter: the disk radius. The disk mask structure is similar to that of the structure shown in FIGS. 3C and 3D. The diffusion process within the disk depends only on the radial component. The diffusion along cylinder axis is suppressed by the presence of diffusion barriers similar to the barrier layer used for the lines. Consequently, there is no difference between the disks and the cylinders. Because the one-dimensional diffusion process is slightly different in radial coordinates, the functional dependence of the average remaining dopant within the disks on disk radii will be somewhat different than that of the average remaining dopant within the lines on lines width. Yet, the system of disks behaves very similar to the system of lines showing the same strong functional dependence of dopant in the case of diffusion-limited extraction regime and a high sensitivity to the disk radius (when characteristic diffusion length is comparable to the nominal disk radius). Therefore, the inventive method is readily applicable for trimming or correcting the size of a plurality of small disks.

In another example, the length (or height) of a set of cylinders can be corrected using the inventive method. The cylinders or rods are comprised of the core material 62 and are wrapped around with a diffusion barrier 60. The barrier 60 may be in the form of a spacer for vertically oriented cylinders or rods. The cylinder may represent an opening in a substrate filled with the core material 62. In this case, the substrate may contain the diffusion barrier 60 or the diffusion barrier 60 can be deposited into the opening prior to depositing the core material 62. The diffusion barrier 60 does not cover at least one of cylinder ends. In such configuration, the dopant diffusion process is substantially one-dimensional with respect to cylinder axis coordinate. Applicants note that the cylinder cross section may have any shape (circular, rectangular, star, pentagon, etc.) as long as it does not vary much with cylinder length. The variation of cylinder cross section shape has a similar effect as the variation of the core material 62 thickness in case of the lines shown in FIG. 3D. As indicated above, a diffusion-limited dopant removal process depends weakly on the initial dopant concentration or, equivalently, the volume variation due to the cross section variation. Therefore, the inventive method is still useful for a set of cylinders with varying cross section shape (within each cylinder and from cylinder to cylinder) provided that the cylinder cross section variation accounts for less than about 30% of cylinder volume variation.

Applicants also note that in a limiting case when cylinder radius (or equivalent characteristic dimension) is much larger than the length of its axis, a cylinder becomes a film island with length of cylinder axis being the island (film) thickness. If island thickness is much less (5 times less, for example) than its characteristic size, the diffusion barriers are not required, for the central portion of the island has a one-dimensional diffusion process. The island can be as large as the entire wafer. For instance, in this case, the inventive method can be employed to reduce the thickness variations of a silicon-on-insulator (SOI) layer over an entire SOI substrate.

In some useful applications, only a subset of structures has a one-dimensional symmetry suitable for the application of the inventive method. As eluded above, the inventive method can be applied in such cases with the aid of extra block mask(s). For example, an optional photoresist block mask is disposed immediately prior to the self-correcting etching step. The mask covers structures without the required one-dimensional symmetry and/or any other structures that need no (or reduced) trimming or correction and exposes the subset of structures for self-correcting etch. One useful example for applying such optional mask is the process of trimming/correcting the transistor gate structures in integrated circuits. Typical gate conductor structure can be roughly divided into a subset of very narrow gates and other wider structures. The narrow gates run over the active area and form high-performance transistors while wider gate structures are used as contact-landing pads, local interconnects, and gates of specialized transistors.

In most cases, the narrow gates are connected to at least one larger gate section. Apparently, the subset of narrow long lines has the one-dimensional symmetry suitable for the inventive method. Nevertheless, other structures may or may not have such symmetry. Furthermore, it is often desirable to preserve the original size of some gate conductor structures. For instance, a certain minimal size of contact-landing pad is needed to accommodate an electrical contact from an upper level. Alternatively, the gate of a specialized transistor is intentionally designed larger than minimal feature size. In the presence of excessive trimming, the pad or the gate of specialized transistor will be intentionally designed larger than its minimal size in order to account for trimming. Such built-in trimming design margin may result in a substantial reduction of component density per unit of area. The penalty in the component density is highly undesirable.

In addition, complex structures may have points of symmetry loss which may be adversely affected by the self-correcting etch. For instance, the junction between a wider section of the gate conductor and a narrow gate line is a point of symmetry loss which leads to the loss of self-correcting etch property in the vicinity of the junction. Accordingly, the narrow gate line in the vicinity of the junction may be severely over etched. The optional block mask addresses all these concerns by simply exposing narrow lines with one-dimensional symmetry and covering other gate structures including junctions between the narrow lines and wider sections. The characteristic size of edge symmetry distortion is the characteristic diffusion length. Because the characteristic diffusion length is selected to be of the order of the line width, the influence of edge symmetry distortion substantially decays at the scale of one line width from the edge. Therefore, it is highly desirable that the block mask covers a small portion of the narrow line adjacent to the junction with other gate structures (symmetry distortion point), the small portion being equal or larger than the line width.

While the benefit of block mask has been shown using gate line example, the mask is also useful in other cases where one needs to select a subset of structures with one-dimensional properties suitable for the inventive method. For instance, in the case of film islands described above, the mask can be used to cover the island edge where the diffusion process is not one-dimensional.

Applicants have shown that the inventive method results in an improved structure with minimized critical dimension variation if applied to a set of one-dimensional structures also have shown that the block mask can be used to select such one-dimensional structures. In the following, applicants define the criteria of what set of structures can be considered one-dimensional and point to the several limitations of the inventive method.

The set of structures of interest has a critical dimension L which may vary from structure to structure. According to the present invention, the structures will be subjected to the diffusion process with the characteristic diffusion length Ld equal or smaller than the critical dimension L. Because the sensitivity of diffusion process on a geometrical perturbation quickly decreases within the length scale of several Ld, the original structures can be divided into substantially statistically independent sections of size 3 L if their dimensions exceed 3 L. For instance, long and narrow lines with width of approximately L are divided into 3 L sections whereas the large film islands with approximate thickness L are divided into 3 L by 3 L sections. The mathematical division process may also result in a number of fractional structures with the dimension of less than 3 L. For instance, a 7 L-long line can be mathematically divided into two 3 L-long sections plus one fractional 1 L-long section. To simplify the analysis, applicants did not consider the fractional sections but allow the minimal statistically independent sections to be of different length from 3 L to 6 L. The whole point of such mathematical division is to obtain a set of statistically independent (with respect to the diffusion process) structures with minimal dimensions. The applicants have shown that any original large structure can be divided into substantially statistically independent sections of size of between 3 L and 6 L if their dimensions exceed 3 L. Some original structures such as a set of narrow and long vertically oriented cylinders or rods with varying height cannot be divided into smaller section because their characteristic measure of cross section is smaller than the critical dimension (height). Therefore, the collection of minimal statistically independent sections (either from the process of mathematical division or original) forms a new set of structures on which we define several random functions and provide the one-dimensionality test using these random functions.

The variation of critical dimension L from structure to structure is characterized by the mean value of L, $L_{nom}$ and a standard deviation parameter $\sigma_L$ in accordance with the generally accepted statistical principals. For practical purposes $\sigma_L$ is limited to below 10% of $L_{nom}$.

The first requirement of one-dimensionality is a limitation of critical dimension variation within each structure within the set. The variation of L within each structure should be substantially smaller than the variation of L from structure to structure. The standard deviation of L within each structure is limited to half of standard deviation of L from structure to structure. One can express such limitation in mathematical terms:

$$var(L_{max}-L_{min})<0.5\ var(L_{ave})=\sigma_L<5\%, \qquad (1)$$

where $L_{max}$, $L_{min}$, $L_{ave}$ are maximum, minimal, and average value of L for each structure (section) in the set, and var( . . . ) is a symbol for standard deviation (variance) of a random function. Note that $L_{max}$, $L_{min}$, $L_{ave}$ are random functions defined on the newly defined set of minimal structures.

The second requirement of one-dimensionality is a restriction on the structure volume variation due to the variation in two dimensions other than the critical dimension L. That is, the variation of the structure volume V should primarily be due to the variation of critical dimension L. The variation of critical dimension L is required to account for more than 60% of the volume variation. One can express this requirement in mathematical terms:

$$var(V) < 1.67\ var(L_{ave}) = 1.67\ \sigma_L, \qquad (2)$$

where V is the structure volume. Note that V is also a random function defined on the set of minimal structures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new is:

1. A method of fabricating a microstructure comprising the steps of:
    providing a structure comprising a multi-layered stack located atop an etchable material, said multi-layered stack comprising a core material including at least one diffusing element located between top and bottom diffusion barrier layers;
    patterning the multi-layered stack to provide a plurality of patterned multi-layered stacks on the etchable material, each patterned multi-layered stack having etched facets;
    heating the patterned multi-layered stacks to cause lateral diffusion of the at least one diffusing element to the etched facets;
    removing the at least one diffusing element from the etched facets; and
    performing a self-correcting dopant-sensitive etching process on a plurality of exposed patterned multi-layered stack to provide patterned lines that have a substantially reduced line width and substantially reduced line width variation.

2. The method of claim 1 wherein said core material comprises a doped glass, doped silicon, or a doped polymer-based material.

3. The method of claim 1 wherein the top and bottom barrier layers are the same or different and comprise a silicon nitride, a metal nitride or a metal oxynitride.

4. The method of claim 1 wherein said patterning of the multi-layered stack includes photolithography and etching.

5. The method of claim 1 wherein said heating is performed at a temperature of from about 100° C. to about 1200° C.

6. The method of claim 1 wherein the at least one diffusing element is removed from the etched facets by an evaporation process.

7. The method of claim 6 wherein the evaporation process includes a gaseous phase about the structure.

8. The method of claim 6 wherein the evaporation process is performed in the presence of a reactive ambient or a neutral ambient.

9. The method of claim 1 wherein the at least one diffusing element is removed using a gettering material that is applied adjacent to the etched facets.

10. The method of claim 1 further comprising a step of covering a subset of patterned features with a block mask to expose only a plurality of select lines, said covering step is performed between said removing and said self-correcting etching process.

11. The method of claim 1 wherein the self-correcting etching removes highly doped patterned multi-layered stacks at a faster rate than lightly doped patterned multi-layered stacks.

12. The method of claim 1 wherein the self-correcting etching removes wider patterned multi-layered stacks at a faster rate than narrower patterned multi-layered stacks.

13. The method of claim 1 wherein the etchable material is a gate conductor.

14. The method of claim 1 further comprising forming a diffusion barrier about each etched facet prior to performing the self-correcting etching process.

15. The method of claim 1 further comprising performing an additional etching step after said self-correcting etching process, said additional etching step removes underlying etchable material.

16. The method of claim 1 wherein the lateral diffusion has a characteristic diffusion length range from about one forth of the nominal line width to about the nominal line width.

* * * * *